United States Patent [19]

Johnson et al.

[11] Patent Number: 5,613,611
[45] Date of Patent: Mar. 25, 1997

[54] CARRIER FOR INTEGRATED CIRCUIT PACKAGE

[75] Inventors: Brian A. Johnson, Upton; Robert E. Malone, Westford; M. William Miller, Andover; Jeffrey Moeller, Somerville, all of Mass.

[73] Assignee: Analog Devices, Inc., Norwood, Mass.

[21] Appl. No.: 653,813

[22] Filed: May 28, 1996

Related U.S. Application Data

[63] Continuation of Ser. No. 282,890, Jul. 29, 1994, abandoned.

[51] Int. Cl.$^6$ ................................................ B65D 85/30
[52] U.S. Cl. ................................. 206/728; 206/722
[58] Field of Search .......................... 206/728, 477, 206/480, 482, 722, 726, 727

[56] References Cited

U.S. PATENT DOCUMENTS

| | | |
|---|---|---|
| 3,427,550 | 2/1969 | Helda et al. .................. 206/728 X |
| 3,684,817 | 8/1972 | Card, Jr. et al. .................. 206/328 |
| 3,700,100 | 10/1972 | Bohanna, Jr. .................. 206/722 |
| 3,892,312 | 7/1975 | Tems .................. 206/328 |
| 4,219,172 | 8/1980 | Murayama .................. 361/769 |
| 4,928,934 | 5/1990 | Morton, Jr. . |
| 5,058,742 | 10/1991 | Ross . |

*Primary Examiner*—Bryon P. Gehman

[57] ABSTRACT

A carrier for carrying IC packages having a bevelled flange and bevelled dog combination which firmly engages a flange of the package in order to hold the package extremely securely to the carrier such that any force applied to the carrier is transmitted wholly and accurately to the package and so that the package does not dislodge easily from the carrier when subjected to acceleration or vibration.

8 Claims, 4 Drawing Sheets

CARRIER FOR INTEGRATED CIRCUIT PACKAGE

This application is a continuation, of application Ser. No. 08/282,890, filed Jul. 29, 1994, now abandoned.

FIELD OF THE INVENTION

The invention relates to carriers for integrated circuit packages. More particularly, the invention relates to a carrier for shake or vibration testing of integrated circuits in which a packaged integrated circuit (IC) is securely fastened within the carrier.

BACKGROUND OF THE INVENTION

Package carriers are commonly used by electronic circuit manufacturers for holding individual packages during labeling, testing, organizing, sorting, and/or packaging for shipment of the ICs. The carriers also frequently are designed to provide a surface which is adapted for engagement with pick and place tools used to handle and transport the packages during testing, labeling, etc. procedures. The carriers also are designed to protect the packages, and particularly the fragile electrical leads which extend from the encapsulated IC. A packaged IC typically is inserted into a carrier by inserting the pins which extend from the encapsulated portion into holding elements in the carrier.

There are many types of standardized and non-standardized package configurations such as dual in-line pin (DIP) packages, single in-line (SIP) packages and TO-type packages. In TO-type packages, the package is cylindrical with parallel leads arranged in a circular pattern extending from the bottom surface of the package. Each of the above-noted exemplary package types are available in various standardized and non-standardized sizes with various numbers of leads. In TO packages, The microcircuit die is packaged within a cylindrical metal enclosure. The enclosure generally comprises two pieces which are secured to each other during packaging. In particular, a cylindrical metal can which is closed on all sides except for the bottom is fitted over and secured to a circular metal plate which forms the bottom surface of the package. The circular plate has a diameter slightly larger than the can such that a flange extends laterally from the bottom surface of the package. Parallel leads extend downwardly from the bottom plate parallel to the axis of the cylindrical can. The leads are arranged in a circle around the periphery of the bottom plate. Also, a button protrudes from the central portion of the bottom surface of the package. FIG. 1 illustrates a TO-package as described above, but including features in accordance with the present invention. Those features will be discussed more fully in the Detailed Description of the Invention section.

The primary purposes of package carriers are (1) to protect the package, (2) to provide a carrier which can be handled by automated equipment for picking and placing, and (3) to retain the package securely in the carrier. With respect to item 3, many ICs must undergo vigorous vibration or shake testing in order to assure that the IC will operate reliably in particular environments. Most ICs which are designed for use in automobiles, aircraft and almost any military application must be able to survive significant vibration or shake testing as well as other testing procedures before they are sold.

It is important that the package not vibrate loose from the carrier when undergoing such vibration or shake testing. In fact, certain types of ICs, particularly those which include a suspended micromechanical structure such as might be included in an acceleration sensor IC, are subject to vibration testing, not only to test the reliability of the IC, but to obtain an output signal during vibration testing. In particular, the carrier is subjected to a known acceleration or vibration and its output is observed to determine if the IC measures the mechanical acceleration accurately. For such ICs, it is particularly important that the IC package be securely fixed to the carrier such that the acceleration or vibration to which the IC is subject is the same as that applied to the carrier. If the package is not securely fixed within the carrier, then the known acceleration or vibration applied to the carrier will not be accurately transferred to the package (and thus the IC). Thus, the IC will be subject, not to the highly calibrated acceleration force desired, but to some unknown force. This will make it impossible to accurately test the precision of the IC's measurement of the acceleration.

U.S. Pat. No. 5,058,742 discloses an electronic circuit carrier of the type to which the present invention pertains. That patent discloses a circuit carrier for a TO-type packaged device comprising a main body section and a tower section which extends above and below the plane of the main body. The tower is of a generally known configuration including eight triangular pyramidal openings spaced equiangularly about the axis of the tower and positioned about the outer perimeter thereof. Positioned intermediate to the ends of the openings are oversized holes through which the leads of the TO packaged device are inserted. The leads engage and deflect resilient fingers molded integrally within the channels and positioned just below the holes in the tower section. The fingers resiliently press the leads into the channel and maintain them in their desired position. The top of the tower section is designed with a raised central flat surface so that only the button extending downwardly from the center of the package rests on the tower. Since the bottom surface of the package is supported in the carrier only on the centrally located button, the package can be easily rocked back and forth in the carrier by force applied to the can. Since the leads are forceably captured in the carrier, rocking of the can may cause the leads to bend.

U.S. Pat. No. 4,928,934 discloses a similar carrier for an integrated TO packaged IC including a plurality of stiffly flexible arms projecting upwardly from the tower portion of the carrier which, when a package is inserted in a carrier, bear against the flange of the package and have an inward projection with a horizontal portion which lodges against the flange surface to retain the package in the carrier. In this carrier also, only the centrally located button on the bottom surface of the package contacts the upper surface of the tower. Accordingly, even though the package is better retained in the carrier by the clips, the package still can be rocked easily by a force applied to the can.

SUMMARY OF THE INVENTION

The invention comprises a carrier for packaged IC packages, particularly of the TO-type. The carrier comprises a main body with a tower portion extending through the main body. The tower portion has on its top surface a plurality of holes arranged in a circular pattern, the holes corresponding in number and position to the leads of the packages which are to be carried by the carrier. The holes open underneath into triangular channels spaced equi-angularly about the axis of the cylindrical tower.

Extending upwardly from the cylindrical side wall of the tower is a substantially circular bevelled rim. The height and the angle of the bevel of the rim is selected such that, at its bottom, the diameter of the rim is substantially equal to, but slightly less than, the minimum expected diameter of the horizontal flange of the IC package which is to be inserted into the carrier and, at its top, the diameter of the flange is substantially equal to, but slightly greater than, the maximum expected diameter of the horizontal flange of the IC package which is to be inserted into the carrier. Also extending upwardly from the main body adjacent to the cylindrical sidewall of the tower is a pair of opposed clips, each including a vertical leg portion having a dog which extends inwardly of the leg and the cylindrical sidewall of the tower. The dog is positioned above the bevelled rim of the carrier. The dog has a bottom surface which is angled inwardly from its bottom to its top.

When a package is inserted into the carrier with its leads extending through the holes into the triangular openings, the angled bottom surface of the dog engages the upper surface of the horizontal flange of the IC package and the bevelled rim of the carrier engages the bottom surface of the horizontal flange of the IC package such that the horizontal flange of the package is grasped firmly and press fit between the bevelled rim and the bevelled dog of the carrier, thus very securely fixing the package to the carrier.

DETAILED DESCRIPTION OF THE INVENTION

Figure 1:
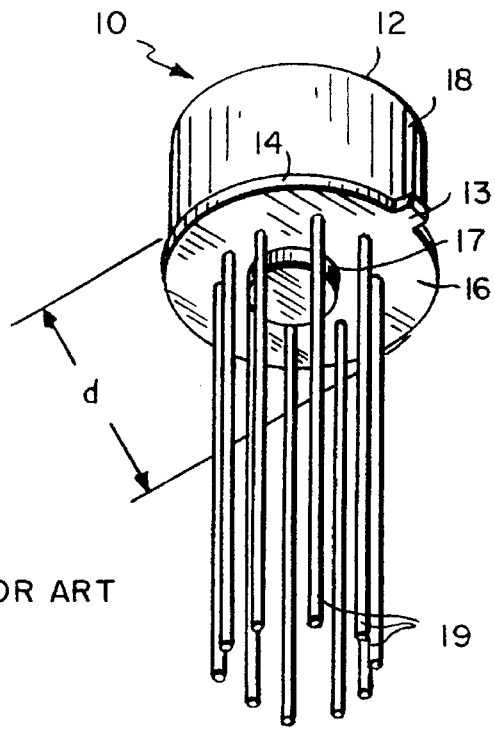
FIG. 1 is perspective view of a TO-type packaged IC.
Figure 2:
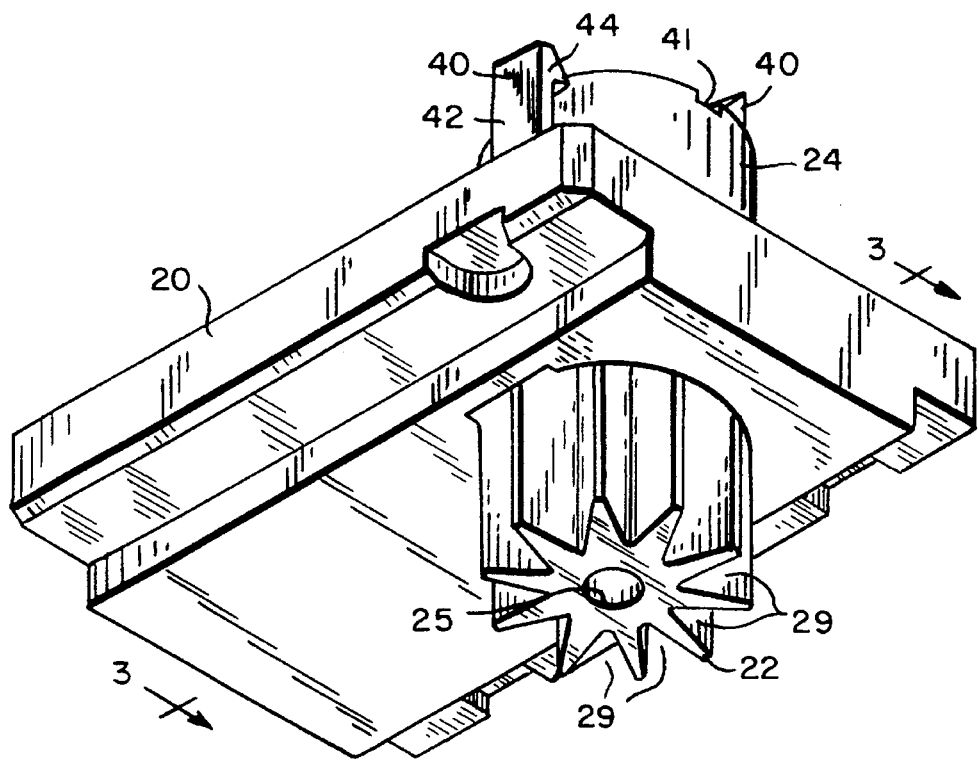
FIG. 2 is a perspective view of an exemplary embodiment of the carrier of the present invention.
Figure 3:
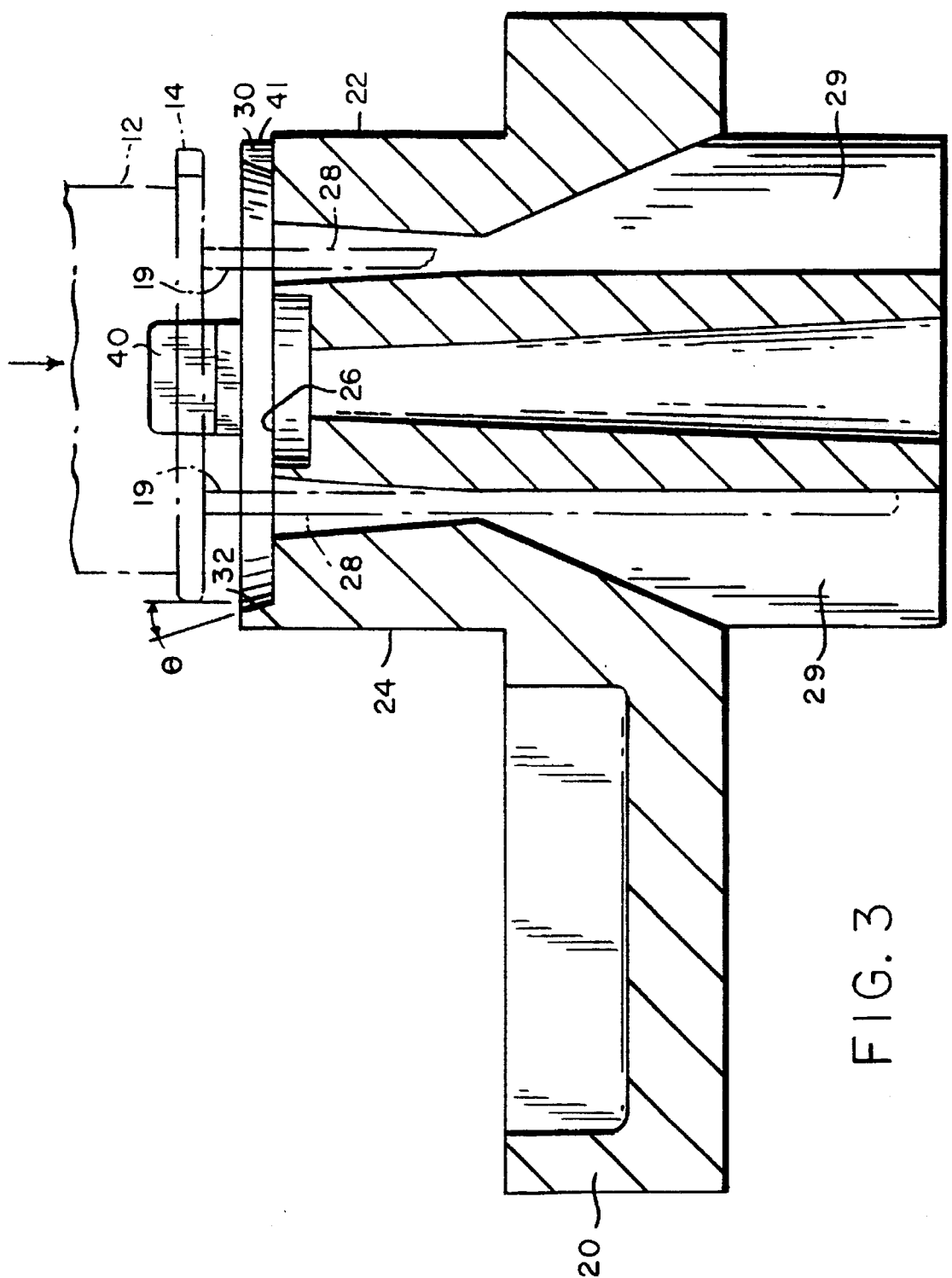
FIG. 3 is a cross-sectional side view of the carrier of FIG. 2.
Figure 4:
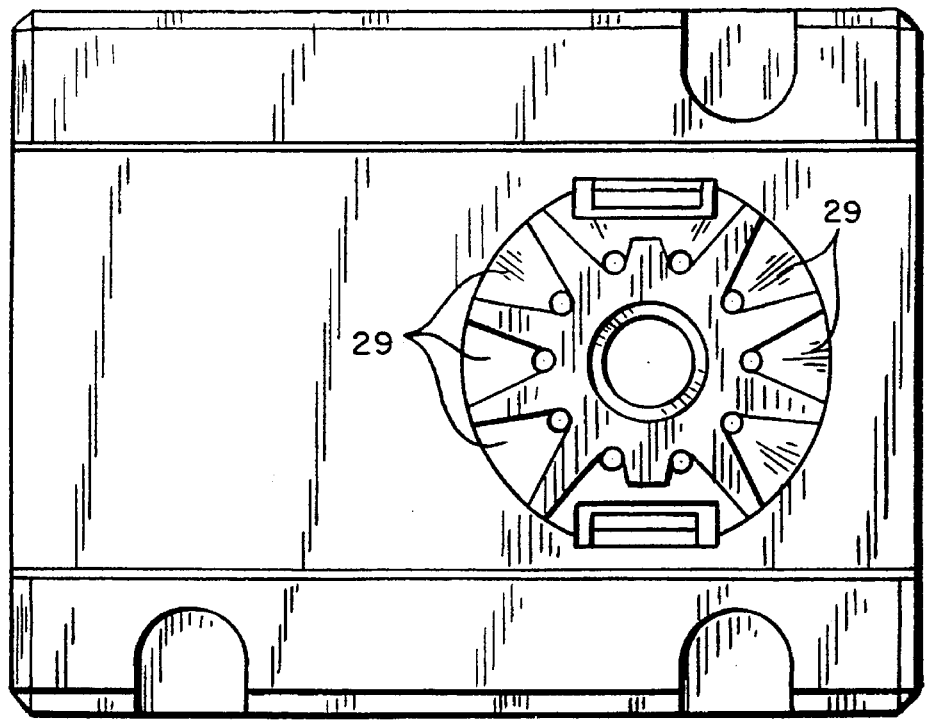
FIG. 4 is a bottom view of the carrier of FIG. 2.
Figure 5:
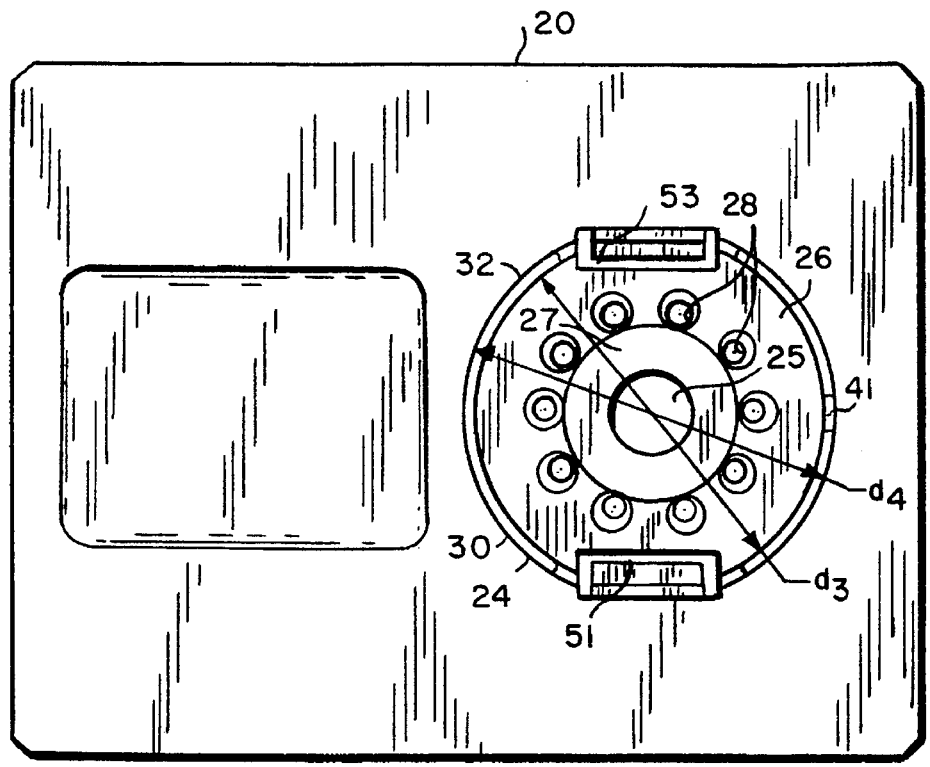
FIG. 5 is a plan view of the carrier of FIG. 2.
Figure 6:
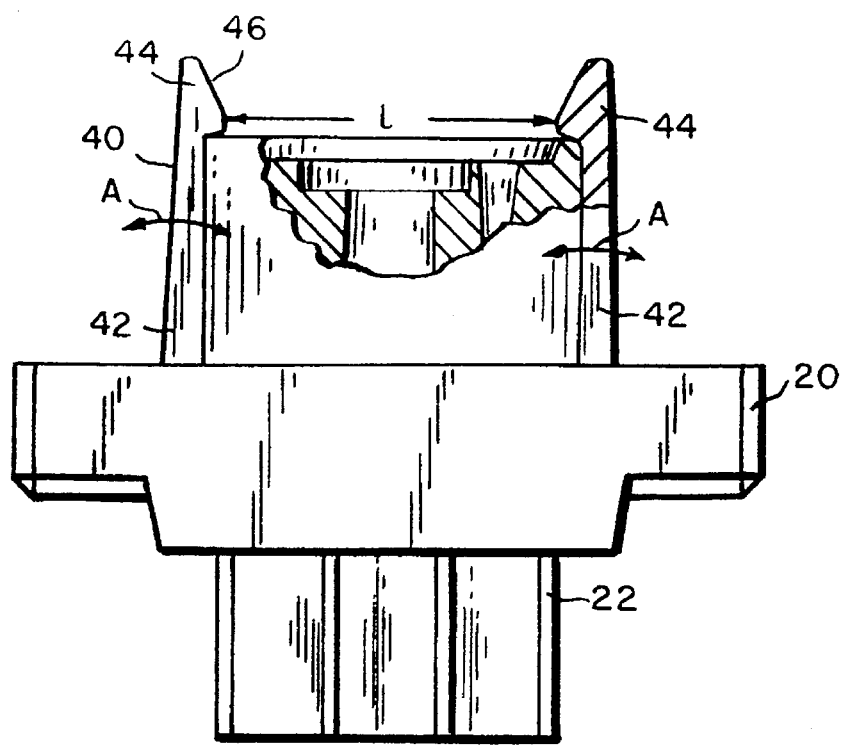
FIG. 6 is a partially cut-away end view of the carrier of FIG. 2.
Figure 7:
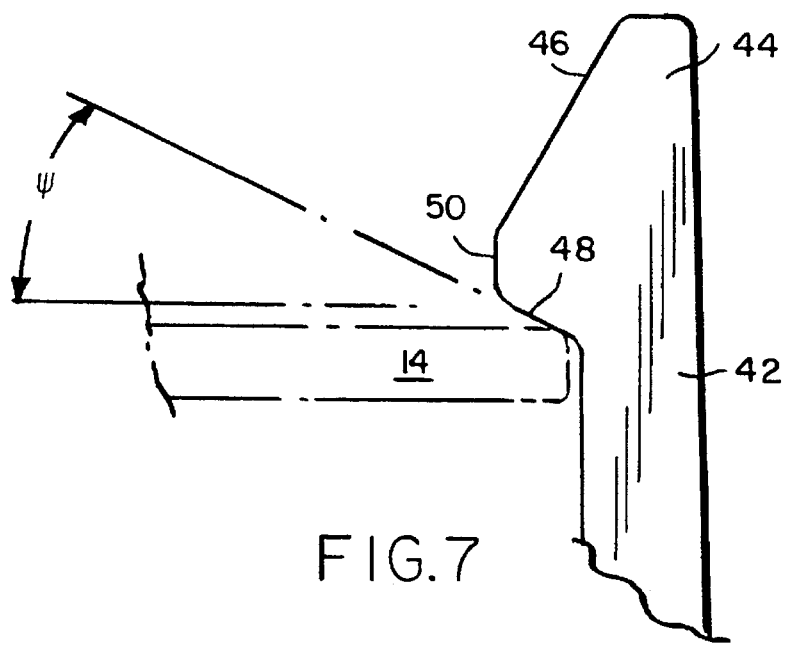
FIG. 7 is an enlarged side view of the clip used in the embodiment of FIGS. 2–6.

One standardized type of TO-type package 10 having ten leads, known as a TO-100 package, is illustrated in FIG. 1. In this particular example, a microcircuit die is enclosed within a cylindrical metal can 12. The bottom plate 16 of the package 10 extends beyond the cylindrical side wall 18 of the can 12 forming a flange 14 which extends laterally beyond the sidewall 18. Ten parallel leads 17 extend from bottom plate 16 of the package in a circular pattern. A button 17 protrudes from the center of the bottom surface 16 of the package 10. The TO package of the present invention differs from the standard package in that it also includes a tab 13 extending laterally from the flange 14. The tab acts as a reference to the leads of the package. In other words the circuit leads for ICs of the same type are always oriented in the same way relative to the tab. For example, for a particular product, it is known that the first lead to the right of the tab 13 is the ground lead.

The invention will now be described with reference to FIGS. 2–7, which depict an exemplary embodiment of a carrier according to the present invention. The carrier comprises a main horizontal body portion 20 and a cylindrical tower portion 22 extending both above and below the main body portion 20. The portion which extends above the main body portion 20 has a cylindrical sidewall 24 and a substantially horizontal top surface 26. As can best be seen in FIG. 5, the top surface has a number of vertical holes 28 extending therethrough and arranged in a circular pattern corresponding to the number and position of the leads of the package which is to be carried by the carrier. The drawings figures show a carrier adapted for use with a ten-pin device. However, it should be understood that any number and arrangement of holes can be incorporated into the device to fit other packages having different numbers and arrangements of leads. Each hole is open below to a triangularly shaped channel 29. Like the holes 28, the channels 29 extend around the outside of the tower and are equi-angularly spaced. One triangular opening 29 corresponds to each hole 28 such that a device 12 can be inserted into the carrier by having its leads 19 inserted through the holes 28 and into the triangular channels 29. Preferably, the channels 29 are open around the periphery of the tower. This provides easy access for coupling the leads to electrical connectors for powering the chip, obtaining an output signal, etc.

The top surface 26 of the tower is essentially planar. However, a notch 27 is formed in the central portion. The notch is sized and shaped to accept the button 17 of the package. Further, an axial hole 25 is formed through the entire length of the tower 22. The hole 25 provides an opening through which a probe can be inserted to contact the button 17 on the bottom plate 16 of the package 10 in order to push the package out of the carrier, when necessary. As will become clear, the package is very securely coupled to the carrier and cannot easily be removed from the carrier simply by grasping the can and attempting to pull the package away from the carrier. Accordingly, the hole 25 is incorporated to allow for easier removal of the package from the carrier.

Extending upwardly above the top surface 26 of the tower from the cylindrical side walls is a bevelled rim 30. The inner surface 32 of the rim 30 is angled outwardly from surface 26 to the top of the flange 30. The angle, $\theta$, and height, h, of the bevelled surface 32 are chosen based on the IC package which the carrier is designed to carry. Particularly, the dimensions of the flange 14 on package 10 typically is known to be bounded between certain minimum and maximum tolerance limits. For instance, the diameter, d, (see FIG. 1) of the flange 14 is known to be within a minimum tolerance, $d_1$, and a maximum tolerance, $d_2$. The angle, $\theta$, and the height, h, of the bevelled surface 32 are chosen such that the diameter, $d_3$, of the rim 30 at or near its bottom is less than the minimum possible diameter, $d_1$, of the horizontal flange 14 of the package which is to be carried by the carrier and the diameter, $d_4$, of the rim 30 at its top is greater than the maximum possible diameter, $d_2$, of the horizontal flange 14 of the package which is to be carried by the carrier.

Accordingly, any package carried by the carrier will rest in the carrier such that the bottom surface of the horizontal flange of the package rests somewhere on the bevelled surface 32 of the rim 30. Alternately, the top surface 26 of the tower portion of the carrier may be bevelled or dish shaped, rather than flat, in order to provide the same effect. Since the package is supported on the rim at the outside edge of the flange, there is no tendency for the package to rock in the tower. Accordingly, because the package cannot rock in the carrier and further because no force is applied directly to the leads to secure the package to the carrier, bending or kinking of the leads is unlikely in the carrier of the present invention.

A notch 41 is formed in the rim. The notch 41 is sized and shaped to engage tab 13 of the package. If the package is not inserted in the carrier with the tab 13 aligned with the notch 41, the flange will not sit properly on the bevelled inner surface 32 of the rim 30. Alignment of the tab with the notch assures that the leads which extend into the channels 29 of the tower always extend into a particular one of the triangular channels 29. Since signals must be input to and received from the IC during testing while it is in the carrier, this assures that the same leads will always end up in the same channel 29. Accordingly, an electrical connector which is positioned in a particular location so as to contact the lead in a particular channel of the carrier will always contact the same lead.

Also extending upwardly from the main body portion 20 of the carrier is a pair of opposed clips 40. The clips 40 comprise a resilient leg portion 42 having a dog 44 at the upper end thereof. The leg portion 42 of the clips 40 are resilient in that they can be flexed in the direction of arrows A in FIG. 6. In this particular embodiment, the tower 22 is notched at 51 and 53 to accommodate the legs 42. However, the legs also could be spaced further from the tower so that notches need not be cut in the tower.

The dogs include an upper bevelled surface 46 and a lower bevelled surface 48. The innermost portion 50 of each dog 40 provides a linear clearance, 1, between the two dogs which is less than the minimum tolerance, $d_1$, of the horizontal flange 22 of the package. The height of the dogs above the top surface 26 of the tower and the angle, $\gamma$, of the lower surface 48 of the dog 40 are selected such that when an IC package having a horizontal flange 14 of a diameter between the minimum tolerance, $d_1$, and maximum tolerance, $d_2$, is resting on the rim 30, the lower surface 48 of the dog 40 engages the flange with the legs 42 flexed outwardly so that they apply a specified minimum amount of force on the flange 14.

In particular, a package 10 is inserted in the carrier by inserting its leads 19 into the holes 28 on the top surface of the tower portion 22 and pushing the package 10 downwardly until the bottom of the horizontal flange 14 of the package 10 engages the upwardly facing bevelled surface 46 of the dog 42. As the package is pushed further downwardly, the legs 42 of the clips 40 will resiliently bend outwardly until the horizontal flange 14 clears the innermost portion 50 of the dogs, at which point the legs will snap back towards each other and the downwardly facing bevelled surface 48 of the dog will engage the horizontal flange 14 and force the package 10 downwardly onto rim 30. Accordingly, the height of the dog, the angle, $\gamma$, of the bevel of surface 48 and the distance, 1, of the clips from each other are selected so that any package having a horizontal flange 14 within the specified tolerance limits will, when seated on the rim 30 engage the bottom surface 48 of the dog 40 so that the resilient legs 42 do not snap back all the way to the rest position, but instead still apply a force on the horizontal flange 14 of the package 12. The force which is applied on the horizontal flange of the package on the bottom surface of the dog is a function of the spring constant of the resilient legs and the angular displacement of the legs from the vertical rest position.

The desired minimum force is dictated by the severity of the vibration or acceleration to which the carrier and package are to be subjected and is probably on the order of 1–2 pounds of force.

In one embodiment of the invention intended for use with TO-100 packaged ICs having 10 leads, the dimensions listed below have been found to be satisfactory.

TABLE $\theta$—bevel angle of carrier rim; 20 degrees $\gamma$—bevel angle of lower bevelled surface of carrier dog; 35 degrees 1—clearance between pins when unbiased; 0.320 inches $d_3$—bottom diameter of carrier rim; 0.357–0.359 inches $d_4$—top diameter of carrier rim; 0.373 inches ref.

$h^4$—height of carrier rim; 0.020 inches

FIGS. 2–7 and the above description pertain to a single embodiment of the present invention. It should be understood from the foregoing, however, that the concept of the present invention can be applied to almost any size, shape or type of IC package. The important features of a carrier according to the present invention are that the carrier provides a surface for supporting the package which contacts the package at the periphery of the package and preferably not elsewhere and that a means is provided to forceably bias the package into contact with that surface. To best achieve only peripheral contact, the support surface of the carrier should be bevelled relative to the bottom surface of the package so that only the edge of the bottom surface rests on the support surface of the carrier. Of course, the carrier must be designed to accommodate the leads extending from the package so that the leads do not interfere with engagement of the package periphery with the carrier surface.

For instance, the present invention can easily be adapted to accommodate a rectangular DIP package. The tower portion would simply be designed with holes shaped and sized to accept pins of that package and the rim would be rectangular rather than circular. Further, it is not necessary that the package have a flange. The dogs could simply be sized and positioned so as to engage the top surface of the package, if no flange is available.

Having thus described a few particular embodiments of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A carrier used for holding an integrated circuit package having a flange extending laterally from a surface of the package and a plurality of leads extending from the package, the flange having an outer periphery, said carrier comprising:

a tower portion having a top surface and a plurality of parallel channels for receiving the leads of the package, a peripheral rim extending upwardly from said tower portion, said rim having an outer surface and a frustoconical inner surface disposed above the top surface of said tower portion, said outer surface and said frustoconical inner surface being joined at an upper edge located above the top surface of said tower portion, said frustoconical inner surface being beveled from a first diameter adjacent to said upper edge to a second diameter adjacent to the top surface of said tower portion, said first diameter being larger than said second diameter, the outer periphery of the flange resting on said beveled inner surface when the package is positioned in said carrier, at least two resilient legs adjacent said rim, each leg having a first end and a second end and flexible between an unbiased position and a biased position, and a dog disposed on each leg, each dog having a lower beveled surface, each said leg and respective dog disposed thereon positioned so that said lower beveled surface of said dog engages the flange of the package when the flange rests on said rim of said carrier with said leg in said biased position such that said lower beveled surface biases the flange generally downwardly into a secure press fit between said rim and said dog.

2. A carrier as set forth in claim 1 wherein said at least two resilient legs oppose each other on opposite sides of said tower portion.

3. A carrier as set forth in claim 2 wherein said dog further comprises an upper bevelled surface adjacent said lower bevelled surface, an upper end of said lower bevelled surface and a lower end of said upper bevelled surface joining to define an innermost portion of said dog, the spacing between said innermost portions of said dogs being less than the diameter of said flange of said package, whereby insertion of said package in said carrier causes said flange to engage said upper bevelled surfaces of said dogs and bias said legs outwardly as said package is pushed into said carrier until said flange clears said innermost portion whereupon said lower bevelled surface engages said flange.

4. A carrier as set forth in claim 3 wherein said legs are parallel to said tower portion of said carrier when unbiased and flex outwardly from said tower portion when a package is inserted in said carrier.

5. A carrier used for holding a TO-type integrated circuit package, the package comprising a cylindrical main body having a sidewall and a bottom wall and a plurality of leads extending from the bottom wall substantially parallel to the sidewall, and a substantially circular flange radiating transversely from the sidewall adjacent the bottom wall, the flange having an outer periphery, said carrier comprising:

a main body portion, a tower portion extending through said main body portion, said tower portion having a top surface, a plurality of parallel channels for receiving the leads of the package and a cylindrical sidewall substantially defining a perimeter of said tower portion, a rim extending upwardly of said cylindrical sidewall substantially parallel to said channels, said rim having an outer surface and a frustoconical inner surface disposed above the top surface of said tower portion, said outer surface and said frustoconical inner surface being joined at an upper edge located above the top surface of said tower portion, said frustoconical inner surface being beveled from a first diameter adjacent to said upper edge to a second diameter adjacent to the top surface of said tower portion, said first diameter being larger than said second diameter, the periphery of the flange resting on said beveled inner surface when the package is positioned in said carrier, at least two opposed resilient legs extending upwardly from said main body portion and adjacent said sidewall, each leg having a first end coupled to said main body portion and a second end and flexible between an unbiased position and a biased position, in which biased position said legs are flexed outwardly from said sidewall and exert a biasing force inwardly toward each other, and a dog disposed at the second end of each leg, each dog having a lower beveled surface and an upper beveled surface, each said leg and respective dog disposed thereon positioned so that, when the flange rests on said rim of said carrier, said lower beveled surface of said dog engages the flange of the package with said leg in said biased position such that said lower beveled surface biases the flange generally downwardly into a secure press fit between said rim and said dog.

6. A carrier as set forth in claim 5 wherein said upper bevelled surface of said dog is adjacent said lower bevelled surface of said dog, an upper end of said lower bevelled surface and a lower end of said upper bevelled surface joining to define an innermost portion of said dog, the spacing between said innermost portions of said dogs being less than the diameter of said flange of said package, whereby insertion of said package in said carrier causes said flange to engage said upper bevelled surfaces of said dogs and bias said legs outwardly as said package is pushed into said carrier until said flange clears said innermost portion, whereupon said lower bevelled surface engages said flange.

7. A carrier used for holding an integrated circuit package having a sidewall and a bottom wall, a flange extending laterally from the sidewall and a plurality of leads extending from the bottom wall, the flange having an outer periphery, said carrier comprising:

a tower having a top surface and a plurality of channels for receiving the leads of the integrated circuit package;

a peripheral rim extending, upwardly from said tower, said rim having an outer surface and a frustoconical inner surface disposed above the top surface of said tower, said outer surface and said frustoconical inner surface being joined at an upper edge located above the top surface of said tower, said frustoconical inner surface being beveled from a first diameter adjacent to said upper edge to a second diameter adjacent to the top surface of said tower, said first diameter being larger than said second diameter, the outer periphery of the flange resting on said frustoconical inner surface when the package is positioned in said carrier; and at least one element for biasing the outer periphery of the flange into contact with said frustoconical inner surface.

8. A carrier as defined in claim 7 wherein said at least one element for biasing comprises at least two resilient legs adjacent said rim, each leg having a first end and a second end and being flexible between an unbiased position and a biased position, and a dog disposed on each leg, each dog having a lower bevelled surface, said leg and said dog being positioned so that said lower bevelled surface engages the flange of said package when said flange rests on said frustoconical inner surface with said leg in said biased position such that said lower bevelled surface biases said flange into contact with said frusto-conical inner surface.

* * * * *